(12) United States Patent
Kim et al.

(10) Patent No.: US 8,629,724 B2
(45) Date of Patent: Jan. 14, 2014

(54) POWER AMPLIFIER

(75) Inventors: Youn Suk Kim, Gyunggi-do (KR); Jun Goo Won, Gyunggi-do (KR); Shinichi Iizuka, Gyunggi-do (KR); Ki Joong Kim, Gyunggi-do (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 0 days.

(21) Appl. No.: 13/362,716

(22) Filed: Jan. 31, 2012

(65) Prior Publication Data
US 2013/0127540 A1 May 23, 2013

(30) Foreign Application Priority Data

Nov. 22, 2011 (KR) .................. 10-2011-0122239

(51) Int. Cl.
*H03F 3/191* (2006.01)
(52) U.S. Cl.
USPC .......................................... 330/302; 330/136
(58) Field of Classification Search
USPC .................. 330/136, 285, 296, 302
See application file for complete search history.

(56) References Cited

U.S. PATENT DOCUMENTS

| | | | | |
|---|---|---|---|---|
| 6,304,145 B1 * | 10/2001 | Laureanti et al. | .............. | 330/285 |
| 6,556,084 B2 * | 4/2003 | Sowlati | .......... | 330/296 |
| 6,650,181 B2 * | 11/2003 | Shinjo et al. | .................. | 330/136 |
| 6,972,628 B2 * | 12/2005 | Eo et al. | ......................... | 330/285 |
| 7,193,460 B1 * | 3/2007 | Naik et al. | .................... | 330/136 |
| 7,609,115 B2 * | 10/2009 | Whelan et al. | ............... | 330/302 |
| 7,622,992 B2 * | 11/2009 | Liu | ............................... | 330/285 |
| 8,089,313 B2 * | 1/2012 | Chang et al. | .................. | 330/136 |

FOREIGN PATENT DOCUMENTS

| KR | 2004-0011673 A | 2/2004 |
|---|---|---|
| KR | 2005-0032172 A | 4/2005 |
| KR | 2008-0058628 A | 6/2008 |

OTHER PUBLICATIONS

Korean Office Action, and English translation thereof, issued in Korean Patent Application No. 10-2011-0122239 mailed Oct. 4, 2012.

* cited by examiner

*Primary Examiner* — Khanh V Nguyen
(74) *Attorney, Agent, or Firm* — McDermott Will & Emery LLP

(57) ABSTRACT

There is provided a power amplifier which may suppress fluctuations in a phase of an output signal in accordance with fluctuations in a level of an input signal by varying an impedance between a signal input terminal and an amplification unit in accordance with a power level of an input signal. The power amplifier includes a bias voltage generation unit generating a bias voltage set in accordance with a power level of an input signal, an amplification unit amplifying the power level of the input signal in accordance with the bias voltage, and an impedance variation unit varying an impedance of a signal transmission path through which the input signal is transmitted to the amplification unit in accordance with the bias voltage.

13 Claims, 5 Drawing Sheets

POWER AMPLIFIER

CROSS-REFERENCE TO RELATED APPLICATIONS

This application claims the priority of Korean Patent Application No. 10-2011-0122239 filed on Nov. 22, 2011, In the Korean Intellectual Property Office, the disclosure of which is incorporated herein by reference.

BACKGROUND OF THE INVENTION

1. Field of the Invention

The present invention relates to a power amplifier which may have a compensation function for compensating an output phase fluctuation (AM-PM) caused in accordance with the fluctuation of an input level.

2. Description of the Related Art

In recent years, mobile communications terminals have come into widespread usage due to the ease of use thereof. With an increase in the use of mobile communications terminals, extending a use period thereof has become a high priority, together with a variety of application activations, so as to provide consumer satisfaction.

In order to increase a mobile communications terminal usage period, it is important to increase the capacity of the battery thereof; however, there are limitations in extending battery life, in that market conditions requiring reductions in the weight, thickness, length, and overall size of a mobile communications terminal indicate that battery size cannot be easily increased. Accordingly, it is necessary to increase the power efficiency of important internal components of mobile communications terminals.

In addition, power amplifiers for transmitting and receiving radio signals are used in the mobile communications terminals. Power amplifiers account for a significant portion of the total power consumption of mobile communication terminals, such that the power efficiency thereof is required to be increased.

Meanwhile, the power amplifier is generally manufactured to include a compound semiconductor; however, a proportion of power amplifiers manufactured using a CMOS (Complementary Metal Oxide Semiconductor) process has gradually increased, due to an increase in the manufacturing costs in the case of the manufacture using a compound semiconductor and an increase in the technological development of the CMOS process and associated circuit design.

Power amplifiers are required in order to satisfy device linearity characteristics required by consumers; however, they are designed so as to satisfy linearity characteristics at a maximum output level, due to a trade-off between power consumption and linearity.

As a method for satisfying linearity characteristics, a method that suppresses fluctuations in the level (AM-AM) of output signals in accordance with a level fluctuation of input signals has mainly been used. However, even in this method, fluctuations in the phase (AM-PM) of the output signal may occur in accordance with the fluctuations in the level of the input signals, such that linearity characteristics may not be satisfied.

SUMMARY OF THE INVENTION

An aspect of the present invention provides a power amplifier that may suppress fluctuations in a phase of output signals in accordance with fluctuations in a level of input signals by varying impedance between a signal input terminal and an amplification unit in accordance with a power level of the input signals.

According to an aspect of the present invention, there is provided a power amplifier, including: a bias voltage generation unit generating a bias voltage set in accordance with a power level of an input signal; an amplification unit amplifying the power level of the input signal in accordance with the bias voltage; and an impedance variation unit varying an impedance of a signal transmission path transmitting the input signal therethrough to the amplification unit in accordance with the bias voltage.

The impedance variation unit may include a transistor turned on or off in accordance with a level of the bias voltage, and an inductor connected, together with the transistor, to the signal transmission path in parallel therewith.

The amplification unit may include an amplification element amplifying the power level of the input signal, a resistor transmitting the bias voltage to the amplification element, and a capacitor blocking a direct current (DC) component of the input signal.

The bias voltage generation unit may include a capacitor blocking the DC component of the input signal; a diode bypassing the input signal to a ground when the power level of the input signal is equal to or greater than a preset level; a transistor receiving a preset operational power source to switch the received power source in accordance with the power level of the input signal; a first resistor, a second resistor, and a third resistor respectively connected to the transistor to transmit signals, and an output capacitor stabilizing the bias voltage from the third resistor connected to the transistor.

The transistor may be an n-type metal-oxide semiconductor field-effect transistor (NMOS FET) that includes a gate receiving the input signal and the bias voltage, a drain connected to the inductor, and a source connected to the ground.

The power amplifier may further include an input impedance matching unit matching, to a preset impedance, the signal transmission path between the input signal and the amplification unit.

The power amplifier may further include an output impedance matching unit matching, to a preset impedance, the signal transmission path between the amplification unit and a signal output terminal through which an amplified signal is output.

According to another aspect of the present invention, there is provided a power amplifier, including: a bias voltage generation unit generating a bias voltage set in accordance with a power level of an input signal; an amplification unit amplifying the power level of the input signal in accordance with the bias voltage; an input impedance matching unit matching, to a preset impedance, a signal transmission path between the input signal and the amplification unit; an output impedance matching unit matching, to a preset impedance, the signal transmission path between the amplification unit and a signal output terminal outputting an amplified signal therethrough; and an impedance variation unit varying an impedance of the signal transmission path between the input impedance matching unit and the amplification unit in accordance with the bias voltage.

The impedance variation unit may include a first inductor having one end connected to the signal transmission path, and an NMOS FET having a gate that receives the input signal and the bias voltage, a drain that is connected to the other end of the first inductor, and a source that is connected to the ground.

The amplification unit may include an amplification element amplifying the power level of the input signal, a first resistor transmitting the bias voltage to the amplification element, and a first capacitor blocking a DC component of the input signal.

The bias voltage generation unit may include a second capacitor blocking the DC component of the input signal; a diode bypassing the input signal to the ground when the power level of the input signal is equal to or greater than a preset level; a transistor receiving a preset operational power source to switch the received power source in accordance with the power level of the input signal; a second resistor, a third resistor, and a fourth resistor respectively connected to the transistor to transmit signals, and a third capacitor stabilizing the bias voltage from the fourth resistor connected to the transistor.

The input impedance matching unit may include a second inductor connected in parallel with the signal transmission path between a signal input terminal through which the input signal is input and the amplification unit; and a fourth capacitor connected between the signal input terminal through which the input signal is input and the amplification unit.

The output impedance matching unit may include a third inductor connected between the amplification unit and the signal output terminal; and a fifth capacitor connected to the signal transmission path between the amplification unit and the signal output terminal, in parallel therewith.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE INVENTION

Figure 1:
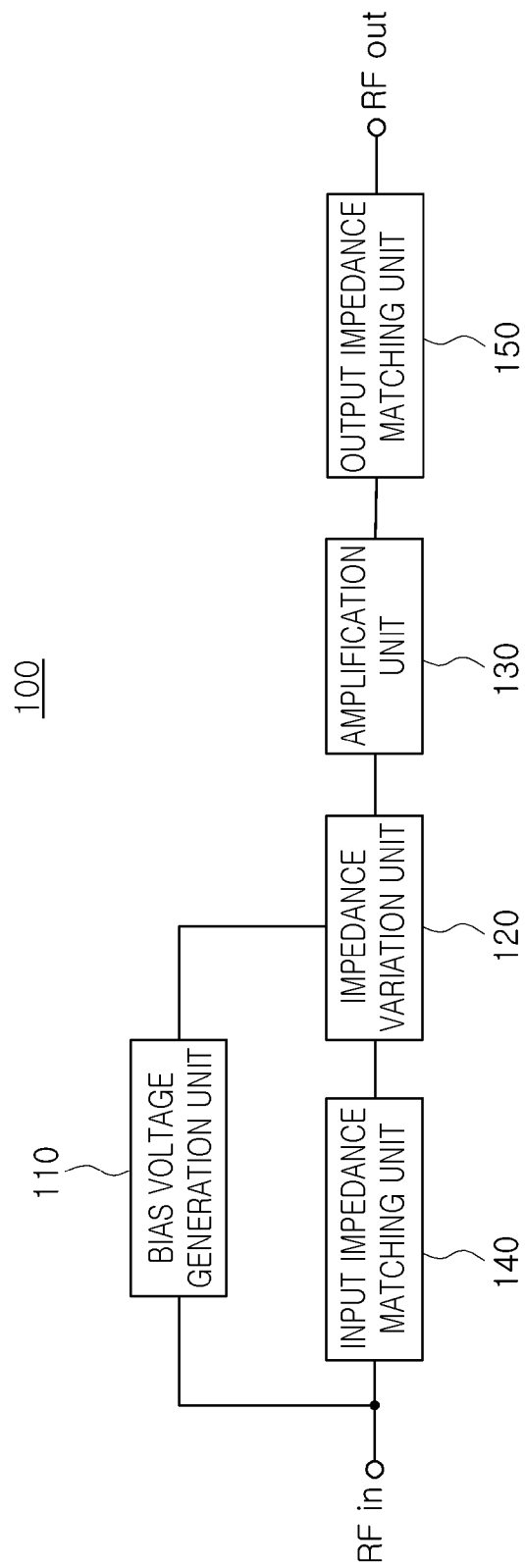
FIG. 1 is a schematic block diagram illustrating a power amplifier according to an embodiment of the present invention.

Embodiments of the present invention will now be described in detail with reference to the accompanying drawings such that they could be easily practiced by those having skill in the art to which the present invention pertains.

However, in describing the embodiments of the present invention, detailed descriptions of well-known functions or constructions will be omitted so as not to obscure the description of the present invention with unnecessary detail.

In addition, like reference numerals denote like elements throughout the drawings.

Unless explicitly described to the contrary, the word "comprise" and variations such as "comprises" or "comprising," will be understood to imply the inclusion of stated elements but not the exclusion of other elements.

In addition, through the entire specification, when any part is "connected with" other parts, this includes a case of being "indirectly connected with" interposing other elements as well as a case of being "directly connected with".

Embodiments of the present invention will now be described in detail with reference to the accompanying drawings.

FIG. 1 is a schematic block diagram illustrating a power amplifier according to an embodiment of the present invention.

Referring to FIG. 1, a power amplifier 100 according to an embodiment of the present invention may include a bias voltage generation unit 110, an impedance variation unit 120, and an amplification unit 130. The power amplifier 100 according to an embodiment of the present invention may further include an input impedance matching unit 140, and an output impedance matching unit 150.

The bias voltage generation unit 110 may generate a bias voltage of which a voltage level is varied in accordance with a power level of an input signal (RFin). For example, when the power level of the input signal (RFin) is increased, the voltage level of the bias voltage may be increased.

The impedance variation unit 120 may vary an impedance in a signal transmission path between a signal input terminal to which the input signal (RFin) is input in accordance with the power level of the input signal (RFin), and the amplification unit 130. For this, the impedance variation unit 120 may receive the bias voltage from the bias voltage generation unit 110 so that the impedance is varied.

The amplification unit 130 may receive the bias voltage from the bias voltage generation unit 110 to thereby amplify the power level of the input signal (RFin). A gain of the amplification unit 130 may vary depending on the voltage level of the bias voltage, so that fluctuations in a level (AM-AM) of an output signal in accordance with fluctuations in a level of an input signal may be suppressed.

The input impedance matching unit 140 may match, to a preset impedance, the impedance in the signal transmission path between the signal input terminal and the amplification unit 130.

The output impedance matching unit 150 may match, to a preset impedance, an impedance in a signal transmission path between the amplification unit 130 and a signal output terminal through which an amplified signal is output.

Figure 2:
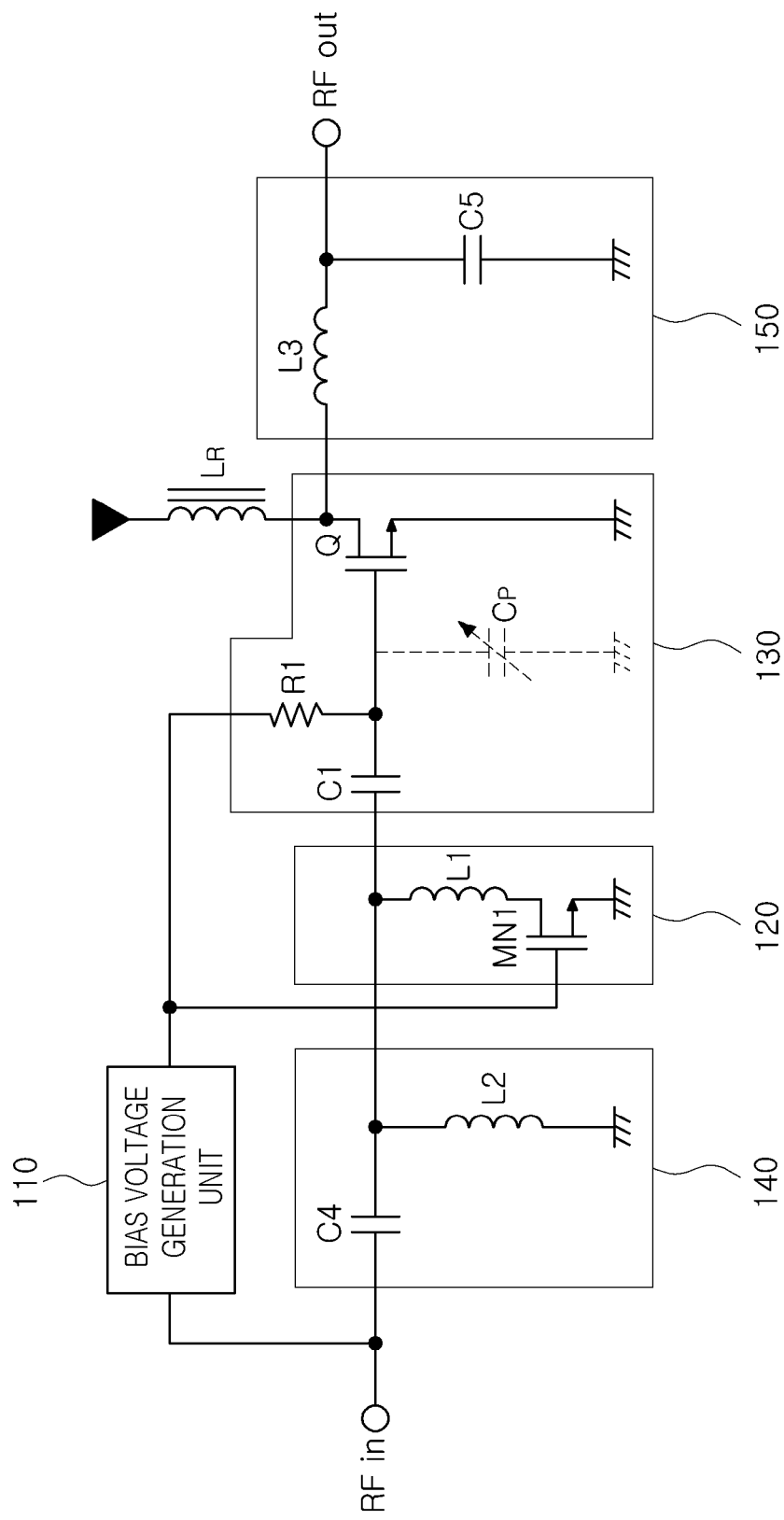
FIG. 2 is a detailed circuit diagram illustrating a power amplifier according to an embodiment of the present invention.

FIG. 2 is a detailed circuit diagram illustrating a power amplifier according to an embodiment of the present invention.

Referring to FIGS. 1 and 2, the impedance variation unit 120 may include at least one transistor and a first inductor (L1). The transistor may be an N MOS FET (MN1).

A gate of the N MOS FET (MN1) may receive the bias voltage from the bias voltage generation unit 110, a source thereof may be connected with the ground, and a drain thereof may be connected with the first inductor (L1).

One end of the first inductor (L1) may be connected with a signal transmission path between the input impedance matching unit 140 and the amplification unit 130, and the other end thereof may be connected with the drain.

The voltage level of the bias voltage from the bias voltage generation unit 110 may reflect fluctuation of the power level of the input signal (RFin), and the N MOS FET (MN1) may be turned-on or turned-off in accordance with the voltage level of the bias voltage. In addition, a degree of being turned-on of the N MOS FET (MN1) may be adjusted in accordance with the voltage level of the bias voltage, so that an impedance of the signal transmission path between the input impedance matching unit 140 and the amplification unit 130 may be varied by the degree of being turned-on of the N MOS FET (MN1) and the first inductor (L1). Accordingly, the impedance variation unit 120 may vary the impedance of the signal transmission path between the input impedance matching unit 140 and the amplification unit 130 in accordance with the power level of the input signal (RFin), and fluctuations in a phase (AM-PM) of an output signal in accordance with fluctuations in a level of the input signal may be suppressed by the variation of the impedance of the signal transmission path between the input impedance matching unit 140 and the amplification unit 130.

The amplification unit 130 may include an amplification element (Q), a first capacitor (C1), and a first resistor (R1).

The amplification element (Q) may be the N MOS FET. Here, the input signal (RFin) and the bias voltage from the bias voltage generation unit 110 may be input to a gate of the amplification element (Q), and the first capacitor (C1) may be formed between the input impedance matching unit 140 and the gate of the amplification element (Q) to thereby block a DC component of the input signal (RFin). A source of the amplification element (Q) may be connected with the ground, and a drain thereof may receive a preset driving power source. Here, the driving power source may be received through an RF chock (LR). The RF chock (LR) may allow the DC component of the driving power source to pass therethrough, and block an alternating current (AC) component thereof.

A parasitic capacitor (Cp) may exist in the amplification element (Q), and may be varied in accordance with the voltage level of the bias voltage, so that an impedance may be varied. Accordingly, the impedance variation unit 120 may vary the impedance in accordance with the voltage level of the bias voltage to thereby compensate the impedance varied by the parasitic capacitor (Cp) of the amplification element (Q).

The first resistor (R1) may be formed between the bias voltage generation unit 110 and the gate of the amplification element (Q) to thereby transmit the bias voltage from the bias voltage generation unit 110 to the gate of the amplification element (Q).

Figure 3:
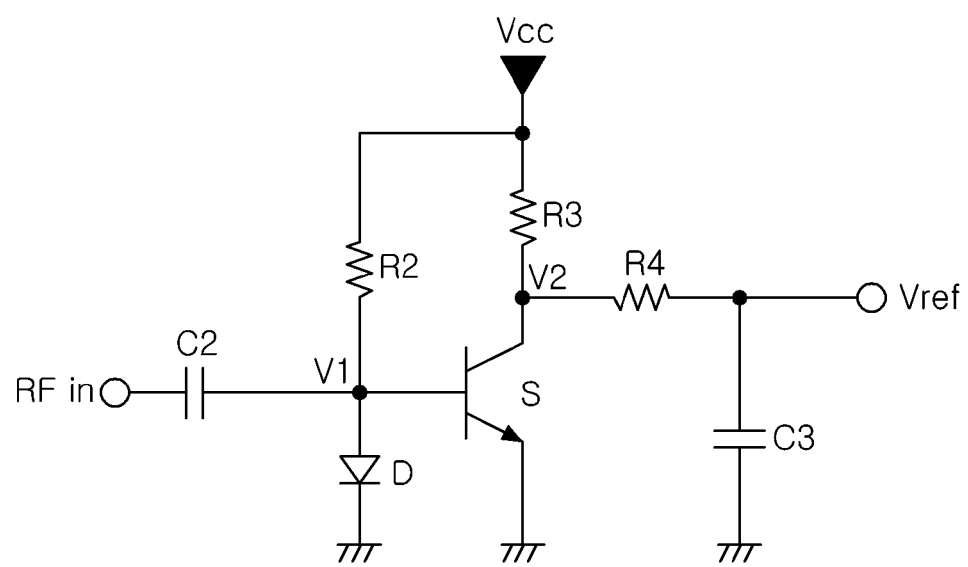
FIG. 3 is a schematic circuit diagram illustrating a bias voltage generation unit adopted in a power amplifier according to an embodiment of the present invention.

FIG. 3 is a schematic circuit diagram illustrating a bias voltage generation unit adopted in a power amplifier according to an embodiment of the present invention.

Referring to FIGS. 1 and 3, the bias voltage generation unit 110 may include second through fourth resistors (R2, R3, and R4), second and third capacitors (C2 and C3), a diode (D), and a transistor (S).

The transistor (S) may be an N-type. Here, an emitter of the transistor (S) may be connected with the ground, a base thereof may be connected with the signal input terminal, and a collector thereof may receive a preset driving power source (Vcc).

The second capacitor (C2) may be formed between the signal input terminal and the base of the transistor (S) to thereby block a DC component of the input signal (RFin).

The diode (D) may be connected between the base of the transistor (S) and the ground, and may bypass the input signal when the power level of the input signal (RFin) is equal to or greater than a preset level.

The second resistor (R2) may be connected between a driving power source terminal supplying the driving power source (Vcc) and the base of the transistor (S), the third resistor (R3) may be connected between the driving power source terminal and the collector of the transistor (S), and the fourth resistor (R4) may be connected between the collector of the transistor (S) and a voltage output terminal through which the bias voltage is output.

The third capacitor (C3) may stabilize the bias voltage output through the fourth resistor (R4).

Figure 4:
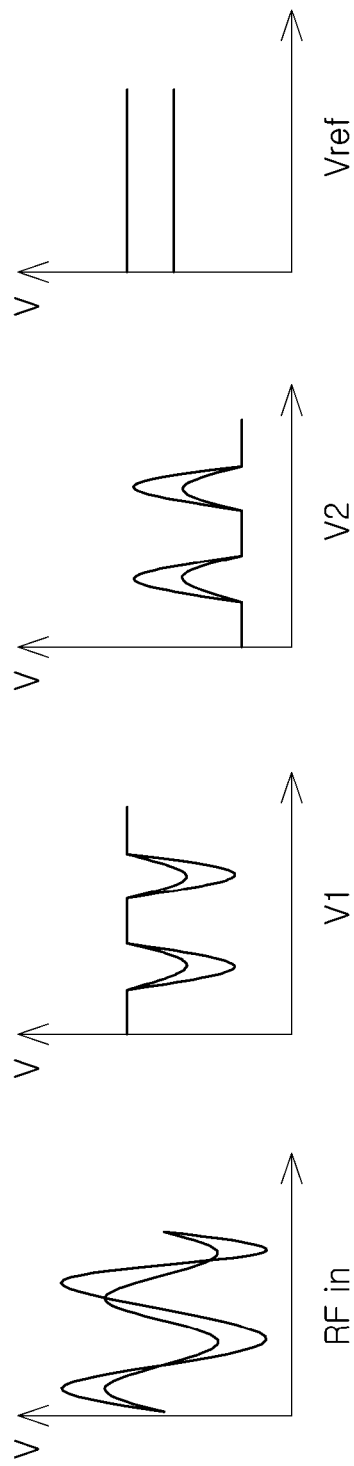
FIG. 4 is a graph illustrating signals of a main part of the bias voltage generation unit illustrated in FIG. 3.

FIG. 4 is a graph illustrating signals of a main part of the bias voltage generation unit illustrated in FIG. 3.

Referring to FIGS. 3 and 4, a power level of the input signal, an input signal (V1) of which a power level is limited by the diode (D), a power level of a signal (V2) amplified by the transistor (S), and a bias voltage (Vref) of which a voltage level is varied in accordance with the power level of the input signal may be shown.

Referring again to FIGS. 1 and 2, the input impedance matching unit 140 adopted in the power amplifier 100 according to the embodiment of the present invention may include a fourth capacitor (C4) that is formed between the signal input terminal and the amplification unit 130 to block a DC component of the input signal (RFin), and a second inductor (L2) that is formed between the signal transmission path between the signal input terminal and the amplification unit 130, and the ground, and that forms a preset impedance with the fourth capacitor (C4) to thereby match an impedance of the signal transmission path between the signal input terminal and the amplification unit 130.

In addition, the output impedance matching unit 150 may include a third inductor (L3) that is formed between the amplification unit 130 and a signal output terminal through which an amplified signal is output, and a fifth capacitor (C5) that is formed between the signal transmission path between the signal output terminal and the amplification unit 130, and the ground, and that forms a preset impedance with the third inductor (L3) to thereby match an impedance of the signal transmission path between the signal output terminal and the amplification unit 130.

Figure 5:
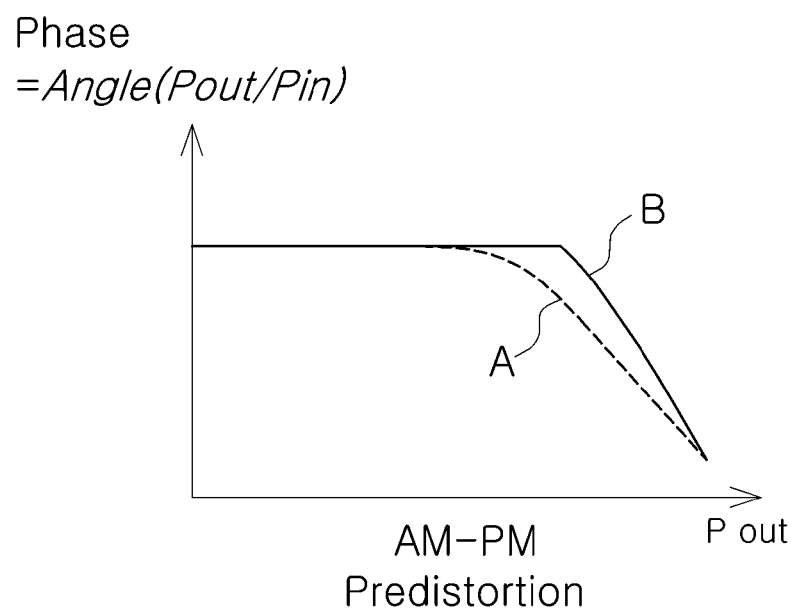
FIG. 5 is a graph illustrating electrical characteristics of a power amplifier according to an embodiment of the present invention in comparison with a power amplifier in the related art.

FIG. 5 is a graph illustrating electrical characteristics of a power amplifier according to an embodiment of the present invention in comparison with a power amplifier in the related art.

Referring to FIG. 5, in comparison with the power amplifier (A) of the related art which compensates only AM-AM distortion, the power amplifier (B) according to an embodiment of the present invention may also compensate AM-PM distortion, and AM-PM distortion (B) may be reduced, so that linearity may be increased.

As set forth above, according to the embodiments of the present invention, the degree of being turned-on of the N MOS FET may be adjusted in accordance with the power level of the input signal to vary the impedance between the signal input terminal and the amplification unit, so that the fluctuations in the phase of the output signal in accordance with the fluctuations in the level of the input signal may be suppressed, thereby increasing linearity.

While the present invention has been shown and described in connection with the embodiments, it will be apparent to those skilled in the art that modifications and variations can be made without departing from the spirit and scope of the invention as defined by the appended claims.

What is claimed is:

1. A power amplifier, comprising:
   a bias voltage generation unit generating a bias voltage set in accordance with a power level of an input signal;
   an amplification unit amplifying the power level of the input signal in accordance with the bias voltage; and
   an impedance variation unit varying an impedance of a signal transmission path transmitting the input signal therethrough to the amplification unit in accordance with the bias voltage to compensate the impedance varied by a parasitic capacitor of the amplification unit.

2. The power amplifier of claim 1, wherein the impedance variation unit includes:
   a transistor turned on or off in accordance with a level of the bias voltage; and an inductor connected, together with the transistor, to the signal transmission path in parallel therewith.

3. The power amplifier of claim 1, wherein the amplification unit includes:
an amplification element amplifying the power level of the input signal;
a resistor transmitting the bias voltage to the amplification element; and
a capacitor blocking a direct current (DC) component of the input signal.

4. The power amplifier of claim 1, wherein the bias voltage generation unit includes:
a capacitor blocking the DC component of the input signal;
a diode bypassing the input signal to a ground when the power level of the input signal is equal to or greater than a preset level;
a transistor receiving a preset operational power source to switch the received power source in accordance with the power level of the input signal;
a first resistor, a second resistor, and a third resistor respectively connected to the transistor to transmit signals; and
an output capacitor stabilizing the bias voltage from the third resistor connected to the transistor.

5. The power amplifier of claim 2, wherein the transistor is an n-type metal-oxide semiconductor field-effect transistor (NMOS FET) that includes a gate receiving the bias voltage, a drain connected to the inductor, and a source connected to the ground.

6. The power amplifier of claim 1, further comprising an input impedance matching unit matching, to a preset impedance, the signal transmission path between the input signal and the amplification unit.

7. The power amplifier of claim 1, further comprising an output impedance matching unit matching, to a preset impedance, the signal transmission path between the amplification unit and a signal output terminal through which an amplified signal is output.

8. A power amplifier, comprising:
a bias voltage generation unit generating a bias voltage set in accordance with a power level of an input signal;
an amplification unit amplifying the power level of the input signal in accordance with the bias voltage;
an input impedance matching unit matching, to a preset impedance, a signal transmission path between the input signal and the amplification unit;
an output impedance matching unit matching, to a preset impedance, the signal transmission path between the amplification unit and a signal output terminal outputting an amplified signal therethrough; and
an impedance variation unit varying an impedance of the signal transmission path between the input impedance matching unit and the amplification unit in accordance with the bias voltage to compensate the impedance varied by a parasitic capacitor of the amplification unit.

9. The power amplifier of claim 8, wherein the impedance variation unit includes:
a first inductor having one end connected to the signal transmission path; and
an NMOS FET having a gate receiving the input signal and the bias voltage, a drain connected to the other end of the first inductor, and a source connected to a ground.

10. The power amplifier of claim 9, wherein the amplification unit includes:
an amplification element amplifying the power level of the input signal;
a first resistor transmitting the bias voltage to the amplification element; and
a first capacitor blocking a DC component of the input signal.

11. The power amplifier of claim 10, wherein the bias voltage generation unit includes:
a second capacitor blocking the DC component of the input signal;
a diode bypassing the input signal to the ground when the power level of the input signal is equal to or greater than a preset level;
a transistor receiving a preset operational power source to switch the received power source in accordance with the power level of the input signal;
a second resistor, a third resistor, and a fourth resistor respectively connected to the transistor to transmit signals; and
a third capacitor stabilizing the bias voltage from the fourth resistor connected to the transistor.

12. The power amplifier of claim 11, wherein the input impedance matching unit includes:
a second inductor connected in parallel with the signal transmission path between a signal input terminal through which the input signal is input and the amplification unit; and
a fourth capacitor connected between the signal input terminal through which the input signal is input and the amplification unit.

13. The power amplifier of claim 12, wherein the output impedance matching unit includes:
a third inductor connected between the amplification unit and the signal output terminal; and
a fifth capacitor connected to the signal transmission path between the amplification unit and the signal output terminal, in parallel therewith.

* * * * *